(12) United States Patent
Tanaka et al.

(10) Patent No.: US 8,828,645 B2
(45) Date of Patent: *Sep. 9, 2014

(54) NEGATIVE RESIST COMPOSITION AND PATTERNING PROCESS

(71) Applicant: Shin-Etsu Chemical Co., Ltd., Tokyo (JP)

(72) Inventors: Akinobu Tanaka, Gifu (JP); Keiichi Masunaga, Jyoetsu (JP); Daisuke Domon, Jyoetsu (JP); Satoshi Watanabe, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/063,752

(22) Filed: Oct. 25, 2013

(65) Prior Publication Data

US 2014/0051025 A1    Feb. 20, 2014

Related U.S. Application Data

(63) Continuation of application No. 12/911,338, filed on Oct. 25, 2010, now Pat. No. 8,603,724.

(30) Foreign Application Priority Data

Dec. 10, 2009    (JP) ................................. 2009-280063

(51) Int. Cl.
| | | |
|---|---|---|
| G03F 7/004 | (2006.01) | |
| G03F 7/26 | (2006.01) | |
| G03F 7/038 | (2006.01) | |
| G03F 7/20 | (2006.01) | |
| G03F 1/00 | (2012.01) | |

(52) U.S. Cl.
CPC . G03F 7/038 (2013.01); *G03F 1/08* (2013.01); *G03F 7/0382* (2013.01); G03F 7/20 (2013.01); *G03F 7/0045* (2013.01); *Y10S 430/111* (2013.01)
USPC ............ 430/270.1; 430/280.1; 430/322; 430/910

(58) Field of Classification Search
CPC ......... G03F 7/004; G03F 7/033; G03F 7/028; G03F 7/038
USPC ................ 430/270.1, 275.1, 280.1, 322, 910
See application file for complete search history.

(56) References Cited

U.S. PATENT DOCUMENTS

| | | | |
|---|---|---|---|
| 5,096,936 | A | 3/1992 | Seko et al. |
| 8,603,724 | B2 * | 12/2013 | Tanaka et al. ............ 430/270.1 |
| 2004/0023151 | A1 | 2/2004 | Takeda et al. |
| 2006/0166133 | A1 | 7/2006 | Koitabashi et al. |
| 2008/0032231 | A1 | 2/2008 | Hatakeyama et al. |
| 2008/0241751 | A1 | 10/2008 | Takeda et al. |
| 2009/0087799 | A1 | 4/2009 | Tachibana et al. |
| 2010/0009299 | A1 | 1/2010 | Watanabe et al. |
| 2011/0177464 | A1 | 7/2011 | Takeda et al. |
| 2011/0200942 | A1 | 8/2011 | Masunaga et al. |

FOREIGN PATENT DOCUMENTS

| | | |
|---|---|---|
| CN | 101387831 A | 3/2009 |
| EP | 1 975 711 A1 | 10/2008 |
| JP | A-8-41150 | 2/1996 |
| JP | A-2001-226430 | 8/2001 |
| JP | A-2004-149756 | 8/2001 |
| JP | A-2006-169302 | 5/2004 |
| JP | A-2006-201532 | 8/2006 |
| JP | A-2006-215180 | 8/2006 |
| JP | A-2008-249762 | 10/2008 |
| JP | 2009-237378 | 10/2009 |
| TW | I291598 | 2/2002 |

OTHER PUBLICATIONS

Jul. 30, 2013 Office Action issued in Chinese Patent Application No. 201010568163.1, with partial English translation.
Feb. 14, 2011 Search Report issued in corresponding European Application No. EP 10 01 5194.3.

* cited by examiner

*Primary Examiner* — Anca Eoff
(74) *Attorney, Agent, or Firm* — Oliff PLC

(57) ABSTRACT

There is disclosed a negative resist composition comprising at least: (A) a base polymer that is alkaline-soluble and is made alkaline-insoluble by action of an acid; (B) an acid generator; and (C) a basic component, wherein the base polymer at least contains a polymer including repeating units represented by the following general formula (1) and general formula (2) and having a weight average molecular weight of 1,000 to 10,000. There can be a negative resist composition hardly causing a bridge in forming a pattern and providing a high resolution and a patterning process using the same.

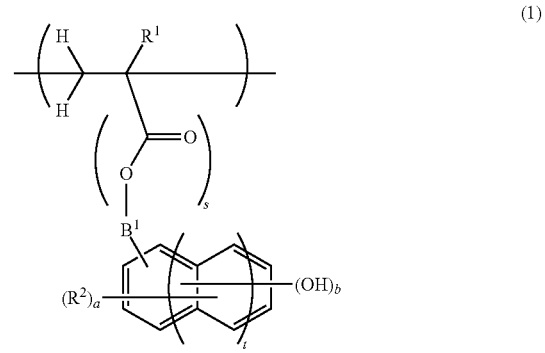

(1)

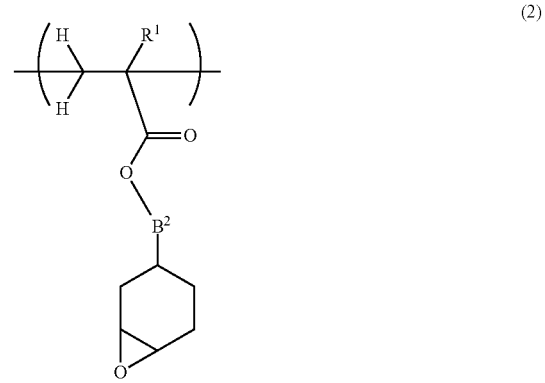

(2)

14 Claims, No Drawings

NEGATIVE RESIST COMPOSITION AND PATTERNING PROCESS

This application is a continuation of U.S. patent application Ser. No. 12/911,338 filed Oct. 25, 2010, the entire contents of which are incorporated herein by reference in their entirely.

BACKGROUND OF THE INVENTION

1. Field of the Invention

The present invention relates to a negative resist composition and a patterning process using the same.

2. Description of the Related Art

In recent years, as an integrated circuit progresses toward a high integration, a further finer patterning is required. Especially, when a resist pattern of 0.2 μm or less is formed, as a usual manner, a chemically amplified resist composition wherein an acid generated by an exposure light acts as a catalyst, from which a high sensitivity and a high resolution can be obtained, has been used. As the exposure light source, a high energy beam such as an ultraviolet beam, a far-ultraviolet beam and EB has been used, and especially, an exposure method by using EB or EUV has been drawing attention as the method that the finest pattern is expected among the methods currently under consideration.

In a resist composition, there are a positive type in which an exposed part is dissolved and a negative type in which an exposed part remains as a pattern. They are selected based on the ease of its use and depending on the required resist pattern. A chemically amplified negative resist composition usually contains a polymer which is alkaline-soluble and is made alkaline-insoluble by action of an acid, and an acid generator generating an acid by decomposition with an exposure light, and, in addition, usually contains a basic compound to control diffusion of the acid generated by the light exposure.

Many negative resist compositions using a phenolic unit as an alkaline-soluble unit constituting the polymer that is soluble in an aqueous alkaline developer have been developed, especially for exposure to a KrF excimer laser beam. These have not been used for an ArF excimer laser beam because a phenolic unit does not transmit the light when the exposure light having a wavelength of 150 to 220 nm is used. However, in recent years, these have been drawing attention again as a negative resist composition for exposure to EB and EUV, which are exposure methods to obtain a further finer pattern, as reported in Japanese Patent Laid-Open (kokai) No. 2006-201532, Japanese Patent Laid-Open (kokai) No. 2006-215180, and Japanese Patent Laid-Open (kokai) No. 2008-249762.

As a further finer pattern is required, negative resist compositions using a hydroxystyrene unit which is the typical structure of the phenolic unit have been improved many times. However, as a pattern size is miniaturized considerably like 0.1 μm or less, conventional materials cannot have solved the problems that a so-called bridge (a finely-filamented resist layer remained between pattern lines of a fine pattern) is easily caused and an undercut occurs at the substrate's interface and thus patterns easily collapse.

In addition, as for so-called substrate dependence of a pattern (a pattern profile change near the substrate due to a material of a substrate to be processed), with a miniaturization of a pattern to be obtained, even a small profile change has become a problem. Especially, when pattern forming is done by using a chemically amplified negative resist on a chromium oxynitride, the outermost surface material of a photomask blank, in processing of the photomask blank, a so-called undercut (a cleavage formed at the contact part of the resist pattern with the substrate) is caused, but conventional materials could not solve it sufficiently.

Further, in the case of the resist elaboration as mentioned above, examples of characteristics to be demanded for resist compositions are not only a higher resolution which is a fundamental performance of a resist, but also a higher etching resistance. This is because a progressive miniaturization of patterns necessitates to progressively decrease thicknesses of resist films. Known as one technique for obtaining such a higher etching resistance, is a method, which also has been disclosed in Japanese Patent Laid-open (Kokai) No. 2008-249762, to introduce a compound: a polycyclic compound such as indene and acenaphthylene, which includes an aromatic ring(s) and a non-aromatic ring(s) having a carbon-carbon double bond conjugated with the aromatic ring, into a polymer having a hydroxystyrene unit as a subsidiary component.

In turn, as polymers for positive resists, it has been proposed to use a polymer having only an indene skeleton such as described in Japanese Patent Application Laid-open (kokai) No. 2004-149756, while another method has been proposed in Japanese Patent Application Laid-open (kokai) No. 2006-169302 to use a unit having an acenaphthylene skeleton by combining it with a hydroxystyrene derivative.

In Japanese Patent Laid-Open (kokai) No. 2008-249762, a polymer comprising a hydroxystyrene unit and a chlorostyrene unit was used as a styrene derivative unit, while a miscible system of triphenyl sulfonium-2,5-dimethylbenzene sulfonic acid and triphenyl sulfonium-2,4,6-triisopropylbenzene sulfonic acid was used as an acid generator. By using this material containing a crosslinker which forms cross-linkages among polymers by the aid of the acid as a catalyst to make the polymer insoluble in a developer, a line-and-space pattern of 60 nm with few undercuts and without a bridge has been obtained. However, pattern formation of 50 nm or less was difficult because of occurrence of a bridge.

SUMMARY OF THE INVENTION

The present invention was made in view of the situation as mentioned above and has an object to provide a negative resist composition in which a bridge hardly occurs in forming a pattern, a higher resolution can be obtained than conventional resist compositions and a pattern collapse can be suppressed effectively and a patterning process using the same.

In order to solve the above problems, the present invention provides a negative resist composition comprising at least:

(A) a base polymer that is alkaline-soluble and is made alkaline-insoluble by action of an acid;

(B) an acid generator; and (C) a basic component, wherein the base polymer at least contains a polymer including repeating units represented by the following general formula (1) and general formula (2) and having a weight average molecular weight of 1,000 to 10,000,

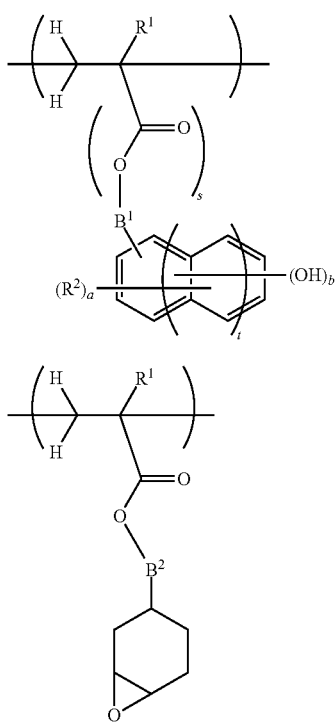

(1)

(2)

wherein $R^1$ represents a hydrogen atom or a methyl group; represents 0 or 1; t represents an integer of 0 to 2; $R^2$ represents a hydrogen atom or an alkyl group having 1 to 6 carbon atoms; each $B^1$ and $B^2$ independently represents a single bond or an alkylene group having 1 to 10 carbon atoms which may contain one or a plurality of an ether bond in the chain of the alkylene group; and a represents an integer of 0 to 3 and b represents an integer of 1 to 3.

By using such a negative resist composition, a resist film providing a high resolution, in which a bridge hardly occurs in forming a pattern, can be obtained, and a fine pattern of 50 nm or less can be developed. Further, an oxirane ring represented by the forgoing general formula (2) has an effect to suppress a pattern collapse because it improves an adhesion property of a resist with a substrate's interface.

It is preferable that the basic component (C) contains at least one or more kinds of amine compounds having a carboxyl group and not having a hydrogen atom covalently bonded to a base-center nitrogen atom.

By using this basic component, occurrence of an undercut is prevented and a desirable pattern profile can be obtained.

It is preferable that the polymer further contains repeating units represented by the following general formula (3) and/or general formula (4),

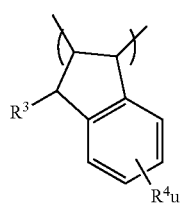

(3)

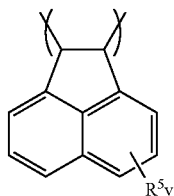

(4)

wherein each $R^3$, $R^4$ and $R^5$ independently represents a hydrogen atom, a halogen atom, an optionally substituted hydroxyl group, an alkoxy group or an alkyl group, and u and v represent an integer of 0 to 5.

By including these units, a high etching resistance can be obtained, a resist film can be made thinner and a resolution also can be improved due to rigidity which the units give to the polymer.

It is preferable that the amine compound having a carboxyl group and not having a hydrogen atom covalently bonded to a base-center nitrogen atom contains one or more kinds of the compounds represented by the following general formulae (5) to (7),

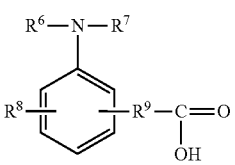

(5)

wherein each $R^6$ and $R^7$ independently represents a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, or an alkyl thioalkyl group having 1 to 10 carbon atoms; $R^6$ and $R^7$ may be bonded to form a cyclic structure; $R^8$ represents a hydrogen atom, a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, an alkyl thioalkyl group having 1 to 10 carbon atoms, or a halogen group; $R^9$ represents a single bond, a linear, a branched or a cyclic alkylene group having 1 to 20 carbon atoms, or an arylene group having 6 to 20 carbon atoms;

(6)

wherein $R^6$, $R^7$, $R^8$, and $R^9$ represent the same meaning as before;

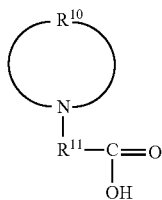 (7)

wherein $R^{10}$ represents a linear or a branched optionally substituted alkylene group having 2 to 20 carbon atoms which may contain one or a plurality of a carbonyl group, an ether group, an ester group, and a sulfide between the carbon-carbon bond of the alkylene group; and $R^{11}$ represents a linear, a branched or a cyclic alkylene group having 1 to 20 carbon atoms, or an arylene group having 6 to 20 carbon atoms.

As mentioned above, the foregoing general formulae (5) to (7) can be exemplified as a chemical structure of the amine compound having a carboxyl group and not having a hydrogen atom covalently bonded to a base-center nitrogen atom.

The basic component (C) can further contain, in addition to the amine compound having a carboxyl group and not having a hydrogen atom covalently bonded to a base-center nitrogen atom, at least one or more kinds of the amine compounds represented by the following general formula (8) and general formula (9),

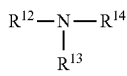 (8)

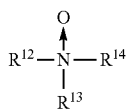 (9)

wherein each $R^{12}$, $R^{13}$, and $R^{14}$ independently represents a hydrogen atom, a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, or an alkyl thioalkyl group having 1 to 10 carbon atoms; and two of $R^{12}$, $R^{13}$ and $R^{14}$ may be bonded to form a cyclic structure or an aromatic ring.

As mentioned above, the basic component (C) can further contain, in addition to the amine compound having a carboxyl group and not having a hydrogen atom covalently bonded to a base-center nitrogen atom, at least one or more kinds of the amine compounds represented by the foregoing general formula (8) and general formula (9).

Further, the present invention provides a resist patterning process by a lithography, wherein, at least, a resist film is formed over a substrate to be processed by using the above-mentioned negative resist composition, and the resist film is exposed to a high energy beam and then developed by an aqueous alkaline developer to obtain a resist pattern.

By using such a resist patterning process of the present invention, even when a line-and-space of 50 nm or less is formed, occurrence of a bridge at space portions can be prevented, and further a pattern collapse can be suppressed.

It is preferable that a film thickness of the resist film is 10 nm or more and less than 100 nm.

Especially, by using such a resist patterning process of the present invention, it is possible to suppress a pattern collapse more certainly to obtain a pattern having a line width of 50 nm or less which was difficult to obtain stably by conventional materials in the case that a film thickness of the resist film is 10 nm or more and less than 100 nm.

A photomask blank can be used as the substrate to be processed. Further, a photomask blank having an outermost surface made of a chromium compound film can be used as the photomask blank.

A photomask blank substrate can be exemplified as a substrate to which the resist patterning process of the present invention can be applied usefully. The resist patterning process of the present invention is especially useful in the case of a photomask blank whose outermost layer is composed of a chromic compound film. It is because a sheet of photomask affects an entire performance of a semiconductor manufactured by using it, and thus a low LER is required, but especially in the case of the chromic compound film, an undercut and a pattern collapse tend to occur more strongly than other nitrogen-containing films. Therefore, by using the resist patterning process of the present invention, a pattern collapse can be suppressed and a pattern having a high resolution and a good pattern profile can be obtained.

By using the negative resist composition of the present invention, even when a line-and-space pattern of 50 nm or less is formed, occurrence of a bridge at space portions can be prevented and a pattern collapse also can be suppressed. Further, by using the amine compound having a carboxyl group and not having a hydrogen atom covalently bonded to a base-center nitrogen atom as a basic component together, even on the substrate to be processed whose surface is composed of a chromic compound, which tends to cause an undercut, an undercut is prevented and a pattern having a desirable profile of the minimum line width of 50 nm or less can be formed.

DETAILED DESCRIPTION OF THE PREFERRED EMBODIMENTS

Although embodiments of the present invention will be explained hereinafter in detail, the present invention is not limited thereto.

A base polymer mainly containing repeating units of a hydroxystyrene unit and a styrene unit substituted with an electron attractive group as a negative resist polymer, which is soluble in an alkaline developer and is made hardly soluble in the developer by the reaction with an acid for crosslinking, has been used as a resist polymer for the exposure to an electron beam and an extreme ultraviolet beam even after the most advanced lithography method by an ultraviolet beam was shifted to ArF. For example, as disclosed in Japanese Patent Laid-open (Kokai) No. 2008-249762, successfully formed was a fine pattern having a good pattern profile of 80 nm by using a resist film having a film thickness of 240 nm by the pattern exposure to an electron beam.

However, when inventors of the present invention used the chemically amplified resist composition realizing a high resolution mentioned above and then attempted to form a pattern having a minimum line width of 50 nm or less, there occurred a problem that fine patterns collapse or a bridge occurred between pattern lines, and therefore, it was impossible to realize a high resolution.

Therefore, a negative resist composition in which a bridge hardly occurs in forming a pattern, a higher resolution can be obtained and a pattern collapse can be suppressed has been required.

Inventors of the present invention assumed a working hypothesis that a high resolution is inhibited by lack of mechanical strength of a resist film used as the resist mentioned above in being developed by an alkaline developer and that a bridge occurs because of a small contrast of crosslinking reactivity (reactivity of a polymer with a crosslinker). Then, they attempted to increase reaction-active sites among polymers by using a unit having an oxirane ring having a high reactivity as a constitutional unit of the polymer material to improve the contrast.

Here, tried were applications of the unit having an oxirane ring, which has a high activity to electrophilic reaction in an alicyclic structure, to a unit for a thermosetting resin (Japanese Patent Laid-open (Kokai) No. H8-41150) and to a resist (Japanese Patent Laid-open (Kokai) No. 2001-226430), but they could not be put to practical use.

Inventors of the present invention incidentally found that when reaction-active sites among polymers were increased by using such a specific unit having an oxirane ring in an alicyclic structure as a constitutional unit of the polymer material, crosslinking efficiency could be increased without largely changing alkali-dissolution rate of the polymer material, and therefore, a fine pattern of 50 nm or less in which a bridge hardly occurred could be developed with suppressing a pattern collapse, thereby succeeded in accomplishing the present invention.

That is, inventors of the present invention tried various possibilities by trial and error, and then found that crosslinking efficiency could be increased, bridge occurrence and a pattern collapse in pattern-formation could be suppressed and a resist film giving a high resolution could be obtained by using a base polymer containing a polymer: including a repeating unit represented by the following general formula (1) having a phenolic group and a repeating unit represented by the following general formula (2) having an oxirane ring, and having a weight average molecular weight of 1,000 to 10,000,

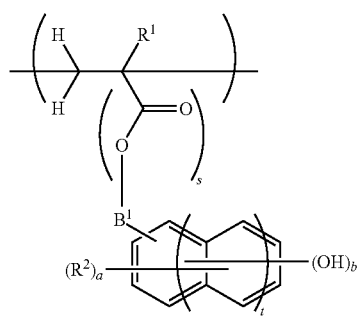

(1)

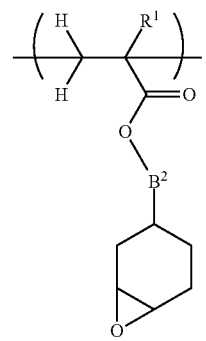

(2)

wherein $R^1$ represents a hydrogen atom or a methyl group; represents 0 or 1; t represents an integer of 0 to 2; $R^2$ represents a hydrogen atom or an alkyl group having 1 to 6 carbon atoms; each $B^1$ and $B^2$ independently represents a single bond or an alkylene group having 1 to 10 carbon atoms which may contain one or a plurality of an ether bond in the chain of the alkylene group; and a represents an integer of 0 to 3 and b represents an integer of 1 to 3.

Preferable amount of the unit having a polar character in its molecule represented by the foregoing general formula (1) depends on strength of the polar character, but generally preferable is more than 30% by mole relative to the total monomer units of a base polymer because it can avoid a possibility that solubility in an alkaline developer decreases to cause a development defect. More preferable is 40% by mole or more, and especially preferable is 50% by mole or more because sufficient solubility in an alkaline developer can be obtained.

In addition, preferable amount of the unit having an oxirane ring represented by the foregoing general formula (2) depends on a dissolution inhibiting effect to an alkaline developer, but generally more preferable is 60% by mole or less, especially preferable is 50% by mole or less. Controlling the amount like this enables to optimize alkali-solubility of the base polymer. Containing the units more is better to improve an adhesion property of a resist with a substrate and crosslinking efficiency, but preferable is 60% by mole or less, and especially preferable is 50% by mole or less because it can avoid a possibility that solubility in an alkaline developer decreases excessively. Preferable amount of the unit for crosslinking the base polymer depends on resist sensitivity, but preferable is 5% by mole or more. 5% by mole or more is preferable because it can avoid a possibility that resist sensitivity becomes excessively low.

Among the repeating units represented by the foregoing general formula (1), a repeating unit not having a linker (—CO—O—$B^1$—) is a unit derived from a monomer in which a vinyl group substituted at the a position or not substituted is bonded to an aromatic ring substituted with a hydroxyl group as typified by a hydroxystyrene unit, and preferable examples thereof include 3-hydroxystyrene, 4-hydroxystyrene, 5-hydroxy-2-vinylnaphthalene, 6-hydroxy-2-vinylnaphthalene, and the like.

A repeating unit having the linker (—CO—O—$B^1$—) is a unit derived from a vinyl monomer substituted with a carbonyl group as typified by (meth)acrylic ester.

Preferable examples of the repeating unit represented by the foregoing general formula (1) and having the linker (—CO—O—$B^1$—) will be concretely exemplified below.

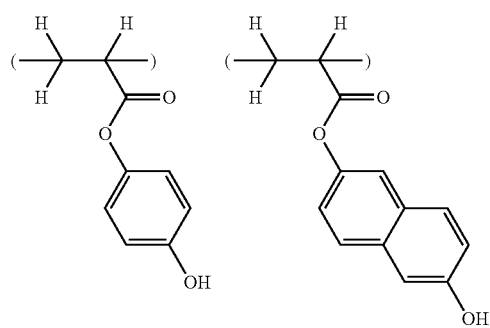
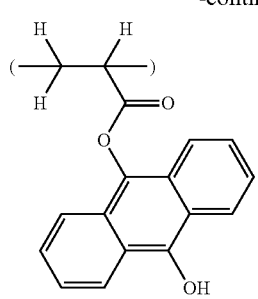
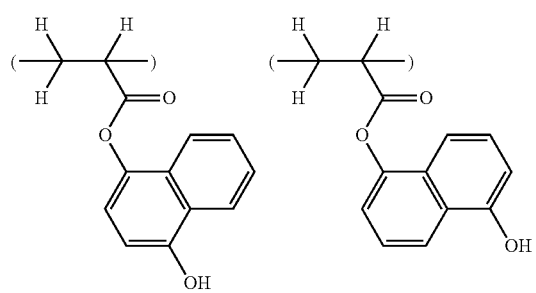
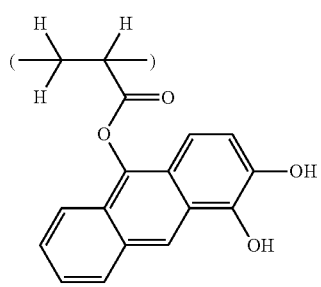
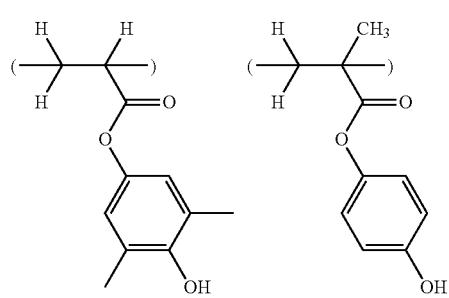
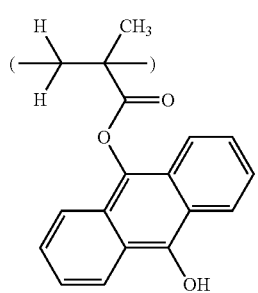
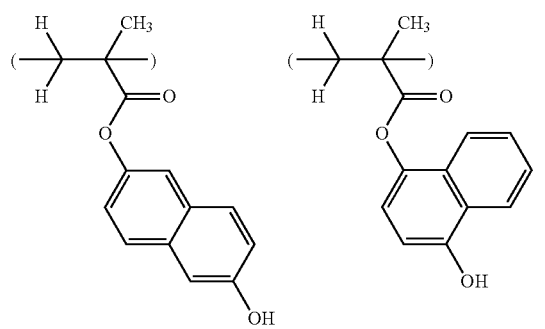
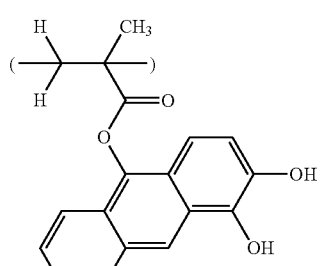
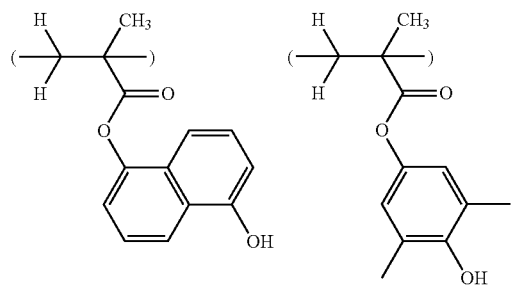
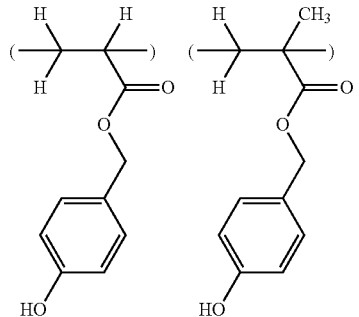

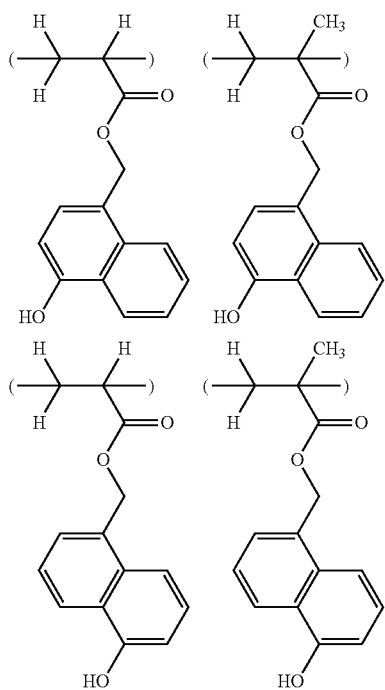

The repeating unit having an oxirane ring represented by the formula (2) is a constitutional unit, in which an acid generator in a resist composition generates an acid by irradiation of a high energy beam, and by the aid of the acid as a catalyst, ring-opening reaction of the oxirane ring is easily caused and crosslinking reaction is caused among polymers to make the base polymer insoluble in an alkaline developer. In addition, the oxirane ring improves an adhesion property of a resist with a substrate's interface, so that it has an effect to suppress a pattern collapse. $B^2$ represents a single bond or an alkylene group having 1 to 10 carbon atoms which may contain one or a plurality of an ether bond in the chain of the alkylene group. Among the above, single bond, a methylene group and an ethylene group are preferable because it can avoid a possibility that rigidity of the polymer and etching resistance are diminished. As for the unit structure, it is preferable that $B^2$ is a single bond from the viewpoint of etching resistance, but an optimum structure is selected corresponding to the reactivity.

Further, by using, in addition to monomer units represented by the foregoing general formula (1) and general formula (2) mainly constituting the polymer used as the base polymer, an indene unit and/or an acenaphthylene unit represented by the following general formula (3) and/or general formula (4), the base polymer can be made more rigid.

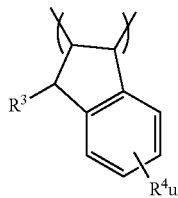

(3)

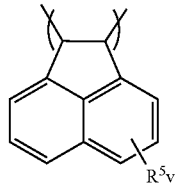

(4)

(In the formula, each $R^3$, $R^4$ and $R^5$ independently represents a hydrogen atom, a halogen atom, an optionally substituted hydroxyl group, an alkoxy group or an alkyl group, and u and v represent an integer of 0 to 5.)

This rigid base polymer has a high carbon density per unit volume, so that it has an excellent etching resistance, thereby having a merit that a thinner resist film can be used. Further, it was turned out that it was advantageous to forming a pattern with a higher resolution.

The introduction of the indene derivative unit represented by the foregoing general formula (3) or the acenaphthylene derivative unit represented by the foregoing general formula (4) to the base polymer have apparent effects when these units are added at 5% by mole or more relative to the total monomer units of the base polymer. In addition, the maximum of the addition amount depends on the substituent $R^4$ or $R^5$. In the case that the substituent $R^4$ or $R^5$ is a hydroxyl group, as for the total amount of these units and the unit represented by the foregoing general formula (1) in designing the base polymer, preferable is 40% by mole or more, and more preferable is 50% by mole or more. In the case that the substituent is not a hydroxyl group, the total amount of these units is not more than the amount that necessary amount of the monomer units represented by the forgoing general formula (1) and general formula (2) can be included, but preferable is 40% by mole or less. Such a not so high amount is preferable because there is no possibility that occurrence of a residue is caused in developing.

Incidentally, it is effective in improving an etching resistance to use a monomer being capable of introducing a cyclic structure into a main chain of a polymer by polymerizing such an indene derivative or an acenaphthylene derivative mentioned above. However, in copolymerizing the indene derivative, units derived from the indene derivative contained in the polymer obtained by the polymerization are considerably few relative to the addition amount of the indene derivative monomer. Therefore, in introducing the indene derivative, even if the derivative has a hydroxyl unit as a substituent, preferable is 40% by mole or less relative to the total monomer units of the base polymer for obtaining a stable polymerization result, and more preferable is 30% by mole or less.

Contrary, in copolymerizing the acenaphthylene derivative, units derived from the acenaphthylene derivative contained in the polymer obtained by the polymerization are almost equal relative to the addition amount of the acenaphthylene derivative monomer. Therefore, the acenaphthylene derivative can be blended arbitrarily in the above range, and variation of the obtained polymer is small, so that the acenaphthylene derivative is preferable in view of quality control of polymers.

Accordingly, inventors of the present invention copolymerized a mixture of monomers containing the acenaphthylene unit of the general formula (4) as a constitutional component in addition to the unit having a phenolic hydroxyl group(s) of the general formula (1) and the unit having a highly reactive oxirane ring of the general formula (2) to obtain a polymer, and prepared a negative resist composition using the polymer as a base polymer for a negative resist. As a result, they found that a resist film having higher resolution and not causing a bridge problem could be obtained.

The polymer can be easily synthesized by radically polymerizing corresponding monomers in a known manner or the like (see Japanese Patent Application Laid-open (kokai) No. 2008-249762, for example). It is also possible to adopt such a manner to conduct the polymerization in a state that the phenolic hydroxyl group(s) is each protected by an acyl group as a protective group which can be alkaline hydrolyzed, or each protected by an acetal, tertiary alkyl group which can be acid hydrolyzed, and then, to conduct a deprotection reaction.

Contrary, it is possible to once conduct polymerization by adopting monomers each having a phenolic hydroxyl group(s), and subsequently conduct a modifying reaction such as acylation of some hydroxyl groups so as to adjust a dissolution rate to establish a polymer to be finally used.

The polymer in the component (A) of the present invention needs to have a weight average molecular weight of 1,000 to 10,000 (measurement is conducted by HLC-8120GPC by TOSOH CORPORATION; based on a gel permeation chromatography using a standard sample of polystyrene).

When the weight average molecular weight is less than 1,000, a heat resistance of the resist material is insufficient and heat deformation is easily caused in some case. When the weight average molecular weight is more than 10,000, there is a problem that a resolution of the resist pattern is easily deteriorated, a bridge tends to occur to easily cause a defect after development. Further, the weight average molecular weight is preferably 8,000 or less, and more preferably 7,000 or less, for decreasing the amount of line edge roughness.

Further, when the molecular weight distribution (Mw/Mn) of the polymer to be used in the negative resist composition of the present invention is narrow, there is no possibility that extraneous substances are found on patterns, or that pattern profiles are deteriorated after exposure, due to presence of polymers having lower molecular weights and/or higher molecular weights. Since the influence of the molecular weight and the molecular weight distribution tends to be increased as pattern rules are made finer, it is preferable that the molecular weight distribution of the multicomponent copolymer to be used is between 1.0 and 2.5, and particularly between 1.0 and 1.8, and is thus low in dispersibility, so as to obtain a resist material to be preferably used for a fine pattern.

In the case of the preparation of the negative resist composition of the present invention, it is preferable that the base polymer component of the resist composition is composed of only one kind of the above-mentioned polymers or only mixture of the above-mentioned polymers so as to obtain the expected performance. However, heretofore known polymers used for a chemical amplified negative resist composition as described in Japanese Patent Laid-Open (kokai) No. 2008-249762, can be added at about 30% of the total polymers in the base polymer. In this case, it is preferable that introduction ratio of the unit represented by the foregoing general formula (2) relative to the total amount of monomer units contained in the all polymers is adjusted to be 5% by mole or more.

The negative resist composition of the present invention does not need a crosslinker because the polymer in the base polymer has a unit having an epoxy group, but a crosslinker can be added. Generally, the following crosslinkers can be added additionally.

The crosslinker reacts with the polymer by the aid of an acid generated from the photoacid generator (B) as a catalyst, in a manner to form cross-linkages within and among molecules of the polymer, thereby making the base resin insoluble in alkali. Typically, this crosslinker is a compound having multiple functional groups which electrophilically react with an aromatic ring(s) or a hydroxyl group(s) included in constitutional units of the base polymer to thereby form linkages, and numerous compounds have been already known therefor.

While any one of known crosslinkers is basically usable as the crosslinker to be contained in the negative resist composition of the present invention, examples of preferable crosslinkers include alkoxymethylglycolurils, and alkoxymethyl melamines, and specific examples of alkoxymethylglycolurils include tetramethoxymethylglycoluril, 1,3-bis-methoxymethyl-4,5-bismethoxyethylene urea and bismethoxymethyl urea. Further, examples of alkoxymethyl melamines include hexamethoxymethyl melamine and hexaethoxymethyl melamine.

Examples of the addition amount of the crosslinker in the negative resist composition of the present invention include 1 to 20 mass parts, preferably 1 to 10 mass parts, relative to 100 mass parts of solid components (the base polymer and the acid generator) of the resist material. Further, the crosslinkers can be used solely or mixedly in two or more kinds.

Basically usable as the acid generator as the component (B) used in the present invention is any one of known acid generators usable for chemically amplified resists (such as those described in Japanese Patent Application Laid-open (kokai) No. 2008-249762).

Examples of preferable photoacid generators include photoacid generators such as sulfonium salts, iodonium salts, sulfonyldiazomethanes and N-sulfonyloxyimides, which can be used solely or mixedly in two or more kinds. Further, examples of preferable counter anions to be possessed by sulfonic acids produced from the salts or compounds include a benzenesulfonic acid anion, toluenesulfonic acid anion, 4-(4-toluenesulfonyloxy)benzenesulfonic acid anion, pentafluorobenzenesulfonic acid anion, 2,2,2-trifluoroethanesulfonic acid anion, nonafluorobutanesulfonic acid anion, heptadecafluorooctanesulfonic acid anion, camphorsulfonic acid anion, and the like.

Although the addition amount of the acid generator as the component (B) in the negative resist composition of the present invention is not particularly limited, such an addition amount is preferably 0.4 to 20 mass parts, more preferably 0.8 to 15 mass parts relative to 100 mass parts of the base polymer as the component (A). It is possible to expect assurance of sensitivity and improvement of resolution by simultaneously increasing the addition amount of the acid generator and the addition amount of the basic component to be described later, and typically 20 mass parts or less can provide a sensitivity-improving-effect effectively and avoid a possibility of uneconomical nature. Further, 0.4 mass part or more is preferable because it can eliminate a necessity to decrease the basic component down to a smaller amount so as to satisfy the demanded sensitivity, thus it can avoid a possibility that the resolution of the formed resist pattern is deteriorated. Particularly, when the resist composition is used to form a resist film for irradiation of radiation or irradiation of electron beam thereto, addition of the acid generator is not problematic in energy attenuation of irradiated radiation within a film though higher sensitivity is not obtained easily, so that the addition amount of the acid generator is preferably made to be a higher concentration such as preferably about 2.0 to 20 mass parts, as compared with a situation of adoption of excimer laser light.

Among the foregoing acid generators, those acid generators based on triphenylsulfonium benzenesulfonate represented by the following general formula are preferable as the acid generator for the negative resist composition of the present invention.

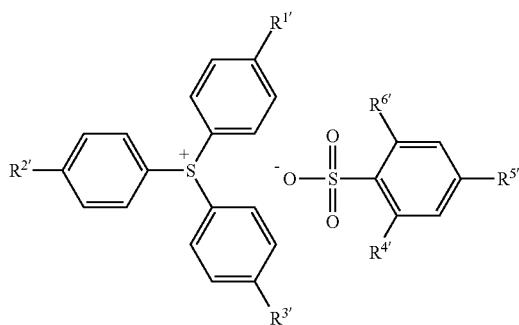

(In the formula, $R^{1'}$, $R^{2'}$, and $R^{3'}$ represent a hydrogen atom, or a linear or a branched alkyl group having 1 to 4 carbon atoms, wherein they may be the same or different; and $R^{4'}$, $R^{5'}$, and $R^{6'}$ represent a linear or a branched alkyl group having 3 to 10 carbon atoms, wherein they may be the same or different.)

The benzenesulfonic acid portion, which is a counter anion of the acid generator, is appropriately adjusted in consideration of a purpose of diffusion control of the acid and a purpose of pattern profile control, by means of an alkyl group(s) to be introduced into its benzene nucleus. The diffusion is suppressed in an order of methyl group<ethyl group<isopropyl group, and the sensitivity of resist is lowered simultaneously therewith. Basically, although the resolution tends to be improved by suppressing diffusion of the acid, the reactivity is then rather lowered occasionally.

Moreover, although it has been known to be desirable to suppress diffusion of the acid so as to decrease undercuts, the reactivity is conversely deteriorated then, thereby defectively making it difficult to increase a crosslinking density. As such, it has been typical to mixingly use an acid generator having 2,5-dimethylbenzenesulfonic acid which is enhanced in diffusion, and an acid generator having 2,4,6-triisopropylbenzenesulfonic acid which is suppressed in diffusion.

However, the base polymer of the present invention in which the unit having an oxirane ring represented by the general formula (2) is used, has high crosslinking efficiency, and an acid generator generating an acid with low diffusion is effective. Preferable examples of the acid generator include 2,4,6-triisopropylbenzenesulfonic acid, 2,4,6-tripropylbenzenesulfonic acid, 2,4,6-tributylbenzenesulfonic acid, 2,4,6-tri-tert-butylbenzenesulfonic acid, 2,4,6-triamylbenzenesulfonic acid, and 2,4,6-triisoamylbenzenesulfonic acid.

Since an acid generated from an acid generator generating a weak acid does not diffuse to the substrate side easily, a pattern with few undercuts can be formed, but the optimum acid generator to be used is selected in consideration of the structure of the polymer from the viewpoint of crosslinking efficiency.

It has been known that a solubility of the resist film in an alkaline developer decreases by an introduction of an alkyl group into a benzene nucleus of a triphenyl sulfonium cation part, and therefore, the alkali-solubility of the resist film can be controlled by the acid generator. When a dissolution rate of the base polymer is high, an acid generator based on a triphenyl sulfonium into which an alkyl group is introduced is effective.

An epoxy group has an excellent adhesion property with a substrate, and thus the base polymer used in the present invention has a merit that a pattern collapse of a fine pattern can be suppressed even in the case of using an acid generator generating an acid with a high diffusion. Preferable examples of the acid generator generating a strong acid include a fluorine-containing acid generator such as triphenylsulfonium nonafluoro-1-butanesulfonate, tris (4-tert-butylphenyl) sulfonium nonafluoro-1-butanesulfonate, and triphenylsulfonium perfluoromethanesulfonate. Fluorine-containing acid generator can largely enhance resist sensitivity.

In the negative resist composition of the present invention as well as other chemical amplified resist compositions, a basic component is added as the component (C). The basic component provides a pattern with a high resolution by controlling a diffusion length of an acid generated from an acid generator in a resist film. Here, any one of known basic components (such as those described in Japanese Patent Application Laid-open (kokai) No. 2008-249762) is basically usable.

However, a basic component using an amine compound having a carboxyl group and not having a hydrogen atom covalently bonded to a base-center nitrogen atom is particularly advantageous material because it can solve the problem that unreacted portion is remained at pattern edge near the substrate (a so-called undercut problem). Such a substrate in which an undercut easily occurs is a substrate or the like having a surface which is composed of nitrided material such as TiN, SiN, SiON. Especially in the case that the surface is composed of metal chromium and a chromium compound containing nitrogen and/or oxygen, undercuts are considerably easily caused, and the above-described basic component has a strong effect for avoiding such a situation.

Preferable examples of a specific chemical structure of the amine compound having a carboxyl group and not having a hydrogen atom covalently bonded to a base-center nitrogen atom include, without any limitations, the amine compounds represented by the following general formulae (5) to (7).

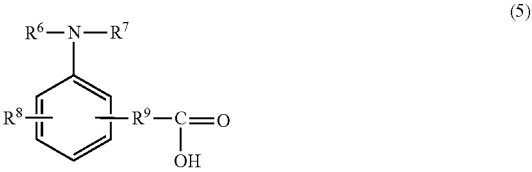

(5)

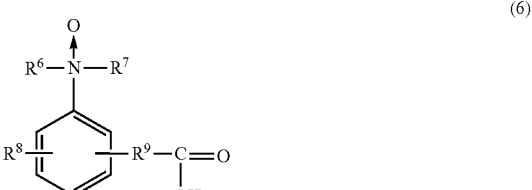

(6)

(7)

(In these formulae, $R^6$ and $R^7$ each represents a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, or an alkyl thioalkyl group having 1 to 10 carbon atoms; $R^6$ and $R^7$ may be bonded to form a cyclic structure; $R^8$ represents a hydrogen atom, a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, an alkyl thioalkyl group having 1 to 10 carbon atoms, or a halogen group; $R^9$ represents a single bond, a linear, a branched, or a cyclic alkylene group having 1 to 20 carbon atoms, or an arylene group having 6 to 20 carbon atoms; $R^{10}$ represents a linear or a branched optionally substituted alkylene group having 2 to 20 carbon atoms which may contain one or a plurality of a carbonyl group, an ether group, an ester group, and a sulfide between the carbon-carbon bond of the alkylene group; and $R^{11}$ represents a linear, a branched, or a cyclic alkylene group having 1 to 20 carbon atoms, or an arylene group having 6 to 20 carbon atoms.)

In the above structural formulae, without any limitations, examples of an aryl group having 6 to 20 carbon atoms concretely include a phenyl group, naphthyl group, anthryl group, phenanthryl group, pyrenyl group, naphthacenyl group, and fluorenyl group; examples of a linear, branched, or cyclic alkyl group having 1 to 20 carbon atoms concretely include a methyl group, ethyl group, propyl group, isopropyl group, butyl group, isobutyl group, t-butyl group, pentyl group, hexyl group, decyl group, cyclopentyl group, cyclohexyl group, and decahydronaphthalenyl group; examples of an aralkyl group having 7 to 20 carbon atoms concretely include a benzyl group, phenethyl group, phenylpropyl group, naphthylmethyl group, naphthylethyl group, and anthracenylmethyl group; examples of a hydroxy alkyl group having 2 to 10 carbon atoms concretely include a hydroxymethyl group, hydroxyethyl group, and hydroxypropyl group; examples of an alkoxyalkyl group having 2 to 10 carbon atoms concretely include a methoxymethyl group, ethoxymethyl group, propoxymethyl group, isopropoxymethyl group, butoxymethyl group, isobutoxymethyl group, t-butoxymethyl group, t-amyloxymethyl group, cyclohexyloxymethyl group, cyclopentyloxymethyl group; examples of an acyloxyalkyl group having 3 to 10 carbon atoms concretely include a formyloxymethyl group, acetoxymethyl group, propionyloxymethyl group, butyryloxymethyl group, pivaloyloxymethyl group, cyclohexane carbonyloxymethyl group, and decanoyloxymethyl group; examples of an alkyl thioalkyl group having 1 to 10 carbon atoms concretely include a methylthiomethyl group, ethylthiomethyl group, propylthiomethyl group, isopropylthiomethyl group, butylthiomethyl group, isobutylthiomethyl group, t-butylthiomethyl group, t-amylthiomethyl group, decylthiomethyl group, and cyclohexylthiomethyl group; examples of the alkylene group having 1 to 20 carbon atoms concretely include a methylene group, ethylene group, methylethylene group, dimethylethylene group, propylene group, methylpropylene group, butylene group, pentylene group, hexylene group, decanyl group, cyclopentylene group, cyclohexylene group, methylenecyclohexylene group, decahydronaphthalenylene group; and examples of the arylene group having 6 to 20 carbon atoms concretely include phenylene group, naphthylene group, anthrylene group, phenanthrylene group, pyrenylene group, naphthacenylene group, and fluorenylene group.

Preferable examples of the amine compounds represented by the general formula (5) include, without any limitations, o-dimethylaminobenzoic acid, p-dimethylaminobenzoic acid, m-dimethylaminobenzoic acid, p-diethylaminobenzoic acid, p-dipropylaminobenzoic acid, p-diisopropylaminobenzoic acid, p-dibutylaminobenzoic acid, p-dipentylaminobenzoic acid, p-dihexylaminobenzoic acid, p-diethanolaminobenzoic acid, p-diisopropanolaminobenzoic acid, p-dimethanolaminobenzoic acid, 2-methyl-4-diethylaminobenzoic acid, 2-methoxy-4-diethylaminobenzoic acid, 3-dimethylamino-2-naphthalene acid, 3-diethylamino-2-naphthalene acid, 2-dimethylamino-5-bromobenzoic acid, 2-dimethylamino-5-chlorobenzoic acid, 2-dimethylamino-5-iodobenzoic acid, 2-dimethylamino-5-hydroxybenzoic acid, 4-dimethylaminophenylacetic acid, 4-dimethylaminophenylpropionic acid, 4-dimethylaminophenylbutyric acid, 4-dimethylaminophenylmalic acid, 4-dimethylaminophenylpyruvic acid, 4-dimethylaminophenyllactic acid, 2-(4-dimethylaminophenyl)benzoic acid, and 2-(4-(dibutylamino)-2-hydroxybenzoyl)benzoic acid.

Preferable examples of the amine compound represented by the general formula (6) include compounds obtained by oxidizing each example of the amine compounds represented by the foregoing general formula (5), without any limitations.

Preferable examples of the amine compound represented by the general formula (7) will be concretely enumerated below, without any limitations.

Namely, examples thereof include 1-piperidinepropionic acid, 1-piperidinebutyric acid, 1-piperidinemalic acid, 1-piperidinepyruvic acid, 1-piperidinelactic acid, and the like.

The amine compound having the amine oxide structure represented by the general formula (6) is to be produced by selecting optimum techniques corresponding to the structures of the compounds. Examples thereof include a technique to adopt an oxidation reaction using an oxidizing agent for a nitrogen-containing compound, and a technique to adopt an oxidation reaction of a nitrogen-containing compound in a diluted solution of hydrogen peroxide, without any limitations. They will be explained in detail.

Exemplarily described below is a production method by an esterification reaction of a nitrogen-containing alcohol compound, and this is also applicable to synthesis of the compound represented by the general formula (6).

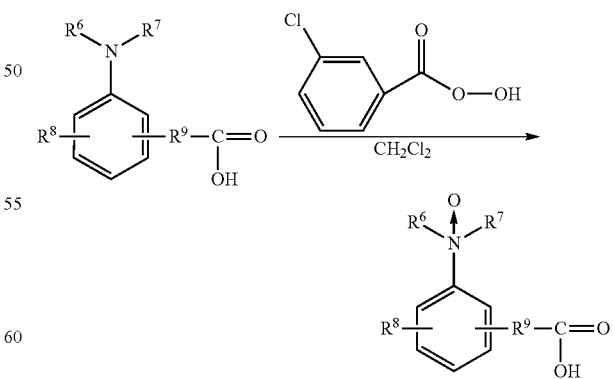

In the above formula, although this reaction is an oxidation reaction of amine adopting an oxidizing agent (m-chloroperbenzoic acid), this reaction can be conducted by another oxidizing agent in a usual manner of an oxidation reaction.

After the reaction, mixed reaction products can be purified by usual manners such as distillation, chromatography and recrystallization as appropriate.

In these amine compounds having a carboxyl group and not having a hydrogen atom covalently bonded to a base-center nitrogen atom in the molecule, the existence of a functional group substituted with a nitrogen atom has made it possible to capture the generated acid rapidly while the carboxyl group is arranged along the substrate side, so that an effect to prevent the generated acid from inactivation caused by diffusion to the substrate may be expected. As a result of the foregoing, it may be assumed that a pattern profile having a higher resolution and an excellent verticality at the substrate's interface of the photoresist into which the amine compound having a carboxyl group is added can be obtained. Accordingly, a much better pattern profile can be obtained by appropriately adjusting the amine compound having a carboxyl group and not having a hydrogen atom covalently bonded to a base-center nitrogen atom in accordance with its physical properties such as volatility, basicity, a capturing rate of an acid, and a diffusion rate in a resist, and also in accordance with a combination of a base polymer and an acid generator to be used.

An amine compound having a carboxyl group and having a hydrogen atom covalently bonded to a base-center nitrogen atom like a primary amine can be used, but as mentioned above, the amine compound having a carboxyl group and not having a hydrogen atom covalently bonded to a base-center nitrogen atom can provide a remedy effect of the undercut to the foregoing substrate. Therefore, it is preferable to adopt a tertiary amine not having a hydrogen atom covalently bonded to a base-center nitrogen atom to realize the effect to the maximum extent.

Further, a weakly basic amine compound having a base-center nitrogen atom included in an aromatic ring such as 2-quinolinecarboxylic acid and nicotinic acid can be used, but it is preferable to adopt a tertiary amine not having a hydrogen atom covalently bonded to a base-center nitrogen atom because it is assumed that a carboxyl group can be arranged along the substrate side and generated acids can be prevented from diffusing into a substrate and from being inactivated.

Note that the effect of the basic component is obtainable irrespectively of a film thickness, and the basic component provides an advantageous effect also in the case of adopting a polymer protected by a tertiary alkyl group for forming a resist film having a thickness of 100 nm or more.

Further, the undercut profile suppressing effect of the amine compound having a carboxyl group and not having a hydrogen atom covalently bonded to a base-center nitrogen atom is to be exhibited because the amine compound is located more concentratedly near the substrate by virtue of carboxyl groups as described above. Thus, for obtaining the above effect, it is not necessarily required that all the basic component (C) is an amine compound having a carboxyl group and not having a hydrogen atom covalently bonded to a base-center nitrogen atom in the molecule, so that the amine compound can be used combinedly with such a basic component to be typically used, other than the above-mentioned amine compound having a carboxyl group and not having a hydrogen atom covalently bonded to a base-center nitrogen atom.

That is, the basic component (C) can further contains, in addition to the amine compound having a carboxyl group and not having a hydrogen atom covalently bonded to a base-center nitrogen atom, at least one or more kinds of the amine compounds represented by the following general formula (8) and general formula (9),

wherein each $R^{12}$, $R^{13}$, and $R^{14}$ independently represents a hydrogen atom, a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, or an alkyl thioalkyl group having 1 to 10 carbon atoms; and two of $R^{12}$, $R^{13}$ and $R^{14}$ may be bonded to form a cyclic structure or an aromatic ring.

The basic component (C) can be used solely or mixedly in two or more kinds; its blending amount is preferably 0.01 to 2 mass parts, in particular 0.01 to 1 mass part relative to 100 mass parts of the base polymer. When the blending amount is excessively low, the blending effect cannot be realized, while the blending amount more than 2 mass parts causes an excessive decrease in the sensitivity in some case.

When the amine compound having a carboxyl group and not having a hydrogen atom covalently bonded to a base-center nitrogen atom is used as a mixture with a conventionally used amine compound other than the above-mentioned amine compound having carboxyl group and not having a hydrogen atom covalently bonded to a base-center nitrogen atom, the blending ratio (mass ratio) of the foregoing amine compound having a carboxyl group and not having a hydrogen atom covalently bonded to a base-center nitrogen atom to the other amine compound is preferably in the range of 100:0 to 10:90.

An organic solvent used for preparing the negative resist composition of the present invention is any organic solvent in which the base polymer, the acid generator, the basic component, other additives, and the like are soluble. Examples of such an organic solvents include: ketones such as cyclohexanone and methyl-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone; which can be used solely or mixedly in two or more kinds, without any limitation. Desirably usable in the present invention among them are ethyl lactate, propylene glycol monomethyl ether, propylene glycol monomethyl ether acetate, and mixed solvents of them, since they are the most excellent in solubility for the acid generator in the resist composition.

The amount of the organic solvent to be used is preferably 1,000 to 10,000 mass parts, in particular 2,000 to 9,700 mass parts, relative to 100 mass parts of the base polymer. By adjusting the concentration like this, even a thin resist film having a film thickness of 10 to 100 nm can be obtained stably and with a high smoothness by using a spin-coating method.

In addition, other than the components as mentioned above, the negative resist composition of the present invention may contain a surfactant (D) that is used conventionally as an arbitrary component to improve the coating properties. Meanwhile, the adding amount of the arbitrary component can be made to a usual amount in the range not damaging the effects of the present invention.

Examples of the surfactant include, without particular limitations, a polyoxyethylene alkyl ether such as polyoxyethylene lauryl ether, polyoxyethylene stearyl ether, polyoxyethylene cetyl ether, and polyoxyethylene olein ether; a polyoxyethylene alkylaryl ether such as polyoxyethylene octylphenol ether and polyoxyethylene nonylphenol ether; a polyoxyethylene polyoxypropylene block copolymer; a sorbitane aliphatic acid ester such as sorbitane monolaurate, sorbitane monopalmitate, and sorbitane monostearate; a nonionic surfactant of a polyoxyethylene sorbitane aliphatic acid ester such as polyoxyethylene sorbitane monolaurate, polyoxyethylene sorbitane monopalmitate, polyoxyethylene sorbitane monostearate, polyoxyethylene sorbitane trioleate, and polyoxyethylene sorbitane tristearate; a fluorinated surfactant such as F-Top EF301, EF303, and EF352 (manufactured by Jemco Inc.), Megafac F171, F172, F173, R08, R30, R90, and R94 (manufactured by Dainippon Ink & Chemicals, Inc.), Flolade FC-430, FC-431, FC-4430, and FC-4432 (manufactured by Sumitomo 3M Ltd.), Asahi Guard AG710, Surflon S-381, S-382, S-386, SC101, SC102, SC103, SC104, SC105 and SC106, Surfinol E1004, KH-10, KH-20, KH-30, and KH-40 (manufactured by Asahi Glass Co., Ltd.); an organosiloxane polymer such as KP-341, X-70-092, and X-70-093 (manufactured by Shin-Etsu Chemical Co., Ltd.); and an acrylic acid or a methacrylic acid polymer such as Polyflow No. 75 and No. 95 (manufactured by Kyoeisha Yushikagaku Kogyo K. K.). Further, a polymer-type surfactant obtained by ring-opening polymerization of a fluorinated oxetane is preferably used because it has a merit not much affecting the resist coating properties even if the addition amount changes. As for the example of it, PF-636 (manufactured by OMNOVA Solutions Inc.) may be mentioned.

These surfactants may be used solely or mixedly in two or more kinds.

The adding amount of the surfactant in the negative resist composition of the present invention is preferably 2 mass parts or less, and more preferably 1 mass part or less, relative to 100 mass parts of the base polymer (A) in the negative resist composition.

Formation of a resist film onto a substrate to be processed by using the negative resist composition of the present invention is done via a coating step of the negative resist composition over the substrate to be processed and a pre-baking step thereafter, wherein any of these steps is carried out by a heretofore known method, so that a resist film having the film thickness depending on the purpose can be formed.

Especially, the patterning process of the present invention is preferable because in the case that a film thickness of a resist film is 10 nm or more and less than 100 nm, it is possible to suppress a pattern collapse more certainly to obtain a pattern having a line width of 50 nm or less which is difficult to obtain stably by conventional materials.

As to the coating step, there are several known coating methods other than a spin-coating method; but when a thin resist film having a film thickness of 10 or more to less than 100 nm is formed as mentioned above, the use of a spin-coating method is preferable in order to obtain a uniform film thickness.

In the case that the substrate to be processed is a semiconductor wafer, coating conditions at the time of a spin-coating need to be adjusted according to a wafer size, an intended film thickness, a composition of the resist composition, and the like. When a resist film with a film thickness of about 100 nm, for example, is intended to be obtained by using an 8-inch wafer (with a diameter of 200 mm), the negative resist composition is cast on the wafer, which is then followed by rotation with the rotation speed of 4,000 to 5,000 revolutions/minute for 40 seconds; by it a resist film having a high uniformity can be formed. Here, the amount of the solvent to be used to prepare the resist composition is 1,400 to 1,600 mass parts relative to 100 mass parts of the base polymer.

Then, the resist film formed by the method as mentioned above is pre-baked in order to remove an excess solvent remained in the film. The conditions of the pre-bake, when it is done on a hot plate, are: usually the temperature range of 80 to 130° C. and the time range of 1 to 10 minutes, and preferably 90 to 110° C. and 3 to 5 minutes.

In the case that the substrate to be processed is a photomask blank, the coating conditions need to be adjusted according to a blank size, an intended film thickness, a composition of the resist composition, and the like, by the same token. When a resist film having a film thickness of about 100 nm is intended to be formed on a square blank with 15.2 cm×15.2 cm, after casting the resist composition on the blank, by rotating it with the rotation speed of 1,000 to 3,000 revolutions/minute for 2 seconds, and then with the rotation speed of 800 revolutions/minute or less for 30 seconds, the resist film having a high uniformity can be formed. Here, the amount of the solvent to be used to prepare the resist composition is 2,000 to 9,700 mass parts relative to 100 mass parts of the base polymer.

Then, the resist film formed by the method mentioned above is pre-baked in order to remove an excess solvent remained in the film. The conditions of the pre-bake, when the pre-bake is done on a hot plate, are: usually the temperature range of 80 to 130° C. and the time range of 4 to 20 minutes, and preferably 90 to 110° C. and 8 to 12 minutes.

Subsequently, the resist film obtained as mentioned above is subjected to a pattern exposure to form an intended pattern. In the case of a semiconductor processing, the exposure is done by covering a mask to form an intended pattern over the foregoing resist film, and a high energy beam such as a far-ultraviolet beam, an excimer laser, an X-ray and an electron beam is used with the exposure dose being 1 to 100 $\mu C/cm^2$ and preferably 10 to 100 $\mu C/cm^2$. In addition to an ordinary exposure method, an immersion method, in which the space between a projection lens and a resist film is immersed in a liquid, can also be used as appropriate.

In the case of processing a photomask blank, a pattern exposure is usually done by a beam exposure because many of the identical products are not intended to be made by the processing. An electron beam is generally used as a high energy beam, but the other foregoing light source can also be used with the beam by the same token.

Usually after the exposure, in order to carry out a chemical amplification reaction by diffusing the acid, a post-exposure bake (PEB) is done, for example, on a hot plate in the temperature range of 60 to 150° C. and in the time range of 4 to 20 minutes, preferably 80 to 140° C. and 8 to 12 minutes. Then, the development is done to form an intended pattern on the substrate by using an aqueous alkaline developer such as tetramethyl ammonium hydroxide (TMAH) with a concentration of 0.1 to 5% by mass, preferably 2 to 3% by mass, with a time of 0.1 to 3 minutes, preferably 0.5 to 2 minutes and by an ordinary method such as a dip method, a puddle method and a spray method. In addition, the pattern size can be adjusted by a further heat treatment (thermal flow) after the development, as appropriate. Incidentally, the negative resist composition of the present invention is most suitably used for fine patterning by a high energy beam, in particular, a far-ultraviolet beam or an excimer laser having a wavelength of 250 to 120 nm, an extreme ultraviolet beam, an X-ray, and an electron beam.

As to a substrate to be processed for a lithography applied with the patterning process using the negative resist composition of the present invention, any substrate such as a semiconductor wafer, an intermediate substrate in the semiconductor manufacturing, and a photomask substrate can be used as far as the processing is conducted by a lithography using a photoresist, but a substrate having a film especially formed of a metal compound by such a method as spattering can realize the effects of the present invention advantageously. Especially in a photomask blank in which a chromium compound film is formed at the outermost surface as a light-shielding film or as an etching mask film, profile control of the resist pattern at the substrate's interface is so difficult that the effects of the present invention especially useful. Examples of the chromium compound usefully applied by the present invention as the substrate's outermost surface material include a metal chromium, chromium oxide, chromium nitride, chromium carbide, chromium oxynitride, chromium oxycarbide, chromium carbonitride, and chromium oxycarbonitride.

EXAMPLES

Although embodiments of the present invention will be explained hereinafter in detail, the present invention is not limited thereto.

Synthesis Example 1

Poured into a flask of 3 L were 238.0 g of 4-acetoxystyrene, 33.1 g of a monomer having the following structure (Z-1), and 189.4 g of indene, as well as 675 g of toluene as a solvent. This reaction vessel was cooled down to −70° C. under nitrogen atmosphere, and repetitively subjected to degasification under reduced pressure and to a nitrogen flow, three times. After temperature elevation up to a room temperature, 40.5 g of 2.2'-azobis(2,4-dimethylvaleronitrile): V-65 (produced by Wako Pure Chemical Industries, Ltd.) as a polymerization initiator was added into the mixture; after further temperature elevation up to 45° C., reaction was conducted for 20 hours; and after temperature elevation thereafter up to 55° C., reaction was further conducted for 20 hours. This reaction solution was then concentrated to ½, and precipitated in 15.0 L of a methanol solution; and the obtained white solid was filtered, followed by drying at 40° C. under reduced pressure, to obtain 311 g of a white polymer.

This polymer was again dissolved in a mixture of 488 g of methanol and 540 g of tetrahydrofuran, followed by addition of 162 g of triethylamine and 32 g of water thereinto, thereby conducting a deprotection reaction at 60° C. for 40 hours. As a fractionation step, after the reaction solution was concentrated, it was dissolved in a mixed solvent of 548 g of methanol and 112 g of acetone, and then 990 g of hexane was dropped into the solution for 10 minutes. This mixed white turbid solution was settled and separated into the layers, and the lower layer (polymer layer) was taken out, and concentrated. Further, the condensed polymer was dissolved again in a mixed solvent of 548 g of methanol and 112 g of acetone, a dispersion and separation operation to the solution was done by using 990 g of hexane, and the obtained lower layer (polymer layer) was concentrated. This condensed solution was dissolved in 870 g of ethyl acetate, thereafter once subjected to neutralizing separation washing by a mixed liquid of 250 g of water and 98 g of acetic acid, and further subjected to separation washing once by 225 g of water and 75 g of pyridine, and four times by 225 g of water. Thereafter, the ethyl acetate solution of the upper layer was concentrated, dissolved in 250 g of acetone, precipitated in 15 L of water, and filtered, followed by vacuum drying at 50° C. for 40 hours, to obtain 187 g of a white polymer.

The obtained polymer was subjected to $^{13}C$, $^1H$-NMR, and GPC measurements, thereby obtaining the following analysis results:

Copolymerization composition ratio (molar ratio): hydroxystyrene:(Z-1):indene=76.7:12.5:10.8
Weight-average molecular weight (Mw)=4,200
Molecular weight distribution (Mw/Mn)=1.59
This polymer was regarded as (Polymer-1).

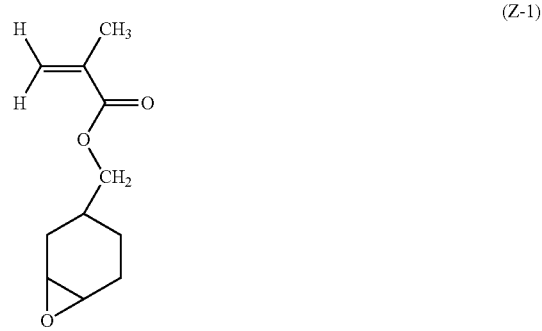

(Z-1)

Synthesis Example 2

Poured into a flask of 3 L were 222.0 g of acetoxystyrene, 47.7 g of (Z-1) monomer, and 30.0 g of acenaphthylene, as well as 675 g of toluene as a solvent. This reaction vessel was cooled down to −70° C. under nitrogen atmosphere, and repetitively subjected to degasification under reduced pressure and to a nitrogen flow, three times. After temperature elevation up to a room temperature, 40.1 g of 2.2'-azobis(2,4-dimethylvaleronitrile): V-65 (produced by Wako Pure Chemical Industries, Ltd.) as a polymerization initiator was added into the mixture; after further temperature elevation up to 45° C., reaction was conducted for 20 hours; and after temperature elevation thereafter up to 55° C., reaction was further conducted for 20 hours. This reaction solution was then concentrated to ½, and precipitated in 15.0 L of a methanol solution; and the obtained white solid was filtered, followed by drying at 40° C. under reduced pressure, to obtain 299 g of a white polymer.

This polymer was again dissolved in a mixture of 488 g of methanol and 540 g of tetrahydrofuran, followed by addition of 162 g of triethylamine and 32 g of water thereinto, thereby conducting a deprotection reaction at 60° C. for 40 hours. As a fractionation step, after the reaction solution was concentrated, it was dissolved in a mixed solvent of 548 g of methanol and 112 g of acetone, and then 990 g of hexane was dropped into the solution for 10 minutes. This mixed white turbid solution was settled and separated into the layers, and the lower layer (polymer layer) was concentrated. Further, the condensed polymer was dissolved again in a mixture of 548 g of methanol and 112 g of acetone, a dispersion and separation operation to the solution was done by using 990 g of hexane, and the obtained lower layer (polymer layer) was concentrated. This condensed solution was dissolved in 870 g of ethyl acetate, thereafter once subjected to neutralizing separation washing by a mixed liquid of 250 g of water and 98 g of acetic acid, and further subjected to separation washing once by 225 g of water and 75 g of pyridine, and four times by 225 g of water. Thereafter, the ethyl acetate solution of the upper layer was concentrated, dissolved in 250 g of acetone, precipitated in 15 L of water, and filtered, followed by vacuum drying at 50° C. for 40 hours, to obtain 165 g of a white polymer.

The obtained polymer was subjected to $^{13}$C, $^{1}$H-NMR, and GPC measurements, thereby obtaining the following analysis results:

Copolymerization composition ratio (molar ratio):
hydroxystyrene: (Z-1): acenaphthylene=77.0:12.5:10.5
Weight-average molecular weight (Mw)=4,700
Molecular weight distribution (Mw/Mn)=1.63
This polymer was regarded as (Polymer-2).

Synthesis Example 3

Poured into a flask of 3 L were 261.2 g of 4-hydroquinone monomethacrylate, 33.1 g of (Z-1) monomer, and 189.4 g of indene, as well as 675 g of methyl ethyl ketone as a solvent. This reaction vessel was cooled down to −70° C. under nitrogen atmosphere, and repetitively subjected to degasification under reduced pressure and to a nitrogen flow, three times. After temperature elevation up to a room temperature, 40.5 g of 2.2'-azobis(2,4-dimethylvaleronitrile): V-65 (produced by Wako Pure Chemical Industries, Ltd.) as a polymerization initiator was added into the mixture; after further temperature elevation up to 45° C., reaction was conducted for 20 hours; and after temperature elevation thereafter up to 55° C., reaction was further conducted for 20 hours. This reaction solution was precipitated in 15.0 L of a hexane solution; and the obtained white solid was filtered, followed by drying at 40° C. under reduced pressure, to obtain 321 g of a white polymer.

The obtained polymer was subjected to $^{13}$C, $^{1}$H-NMR, and GPC measurements, thereby obtaining the following analysis results:

Copolymerization composition ratio (molar ratio):
4-hydroquinone monomethacrylate:(Z-1):indene=76.2: 12.9:10.9
Weight-average molecular weight (Mw)=5,100
Molecular weight distribution (Mw/Mn)=1.51
This polymer was regarded as (Polymer-3).

Synthesis Example 4

Poured into a flask of 3 L were 243.0 g of 4-hydroquinone monomethacrylate, 47.7 g of (Z-1) monomer, and 30.0 g of acenaphthylene, as well as 675 g of methyl ethyl ketone as a solvent. This reaction vessel was cooled down to −70° C. under nitrogen atmosphere, and repetitively subjected to degasification under reduced pressure and to a nitrogen flow, three times. After temperature elevation up to a room temperature, 40.1 g of 2.2'-azobis(2,4-dimethylvaleronitrile): V-65 (produced by Wako Pure Chemical Industries, Ltd.) as a polymerization initiator was added into the mixture; after further temperature elevation up to 45° C., reaction was conducted for 20 hours; and after temperature elevation thereafter up to 55° C., reaction was further conducted for 20 hours. This reaction solution was precipitated in 15.0 L of a hexane solution; and the obtained white solid was filtered, followed by drying at 40° C. under reduced pressure, to obtain 235 g of a white polymer.

The obtained polymer was subjected to $^{13}$C, $^{1}$H-NMR, and GPC measurements, thereby obtaining the following analysis results:

Copolymerization composition ratio (molar ratio):
4-hydroquinone monomethacrylate: (Z-1): acenaphthylene=76.0:13.1:10.9
Weight-average molecular weight (Mw)=5,600
Molecular weight distribution (Mw/Mn)=1.53
This polymer was regarded as (Polymer-4).

Synthesis Example 5

Poured into a flask of 3 L were 354.4 g of acetoxystyrene, and 139.8 g of (Z-1) monomer, as well as 675 g of toluene as a solvent. This reaction vessel was cooled down to −70° C. under nitrogen atmosphere, and repetitively subjected to degasification under reduced pressure and to a nitrogen flow, three times. After temperature elevation up to a room temperature, 40.1 g of 2.2'-azobis(2,4-dimethylvaleronitrile): V-65 (produced by Wako Pure Chemical Industries, Ltd.) as a polymerization initiator was added into the mixture; after further temperature elevation up to 45° C., reaction was conducted for 20 hours; and after temperature elevation thereafter up to 55° C., reaction was further conducted for 20 hours. This reaction solution was then concentrated to ½, and precipitated in 15.0 L of a methanol solution; and the obtained white solid was filtered, followed by drying at 40° C. under reduced pressure, to obtain 312 g of a white polymer.

This polymer was again dissolved in a mixture of 488 g of methanol and 540 g of tetrahydrofuran, followed by addition of 162 g of triethylamine and 32 g of water thereinto, thereby conducting a deprotection reaction at 60° C. for 40 hours. As a fractionation step, after the reaction solution was concentrated, it was dissolved in a mixed solvent of 548 g of methanol and 112 g of acetone, and then 990 g of hexane was dropped into the solution for 10 minutes. This mixed white turbid solution was settled and separated into the layers, and the lower layer (polymer layer) was concentrated. Further, the condensed polymer was dissolved again in a mixture of 548 g of methanol and 112 g of acetone, a dispersion and separation operation to the solution was done by using 990 g of hexane, and the obtained lower layer (polymer layer) was concentrated. This condensed solution was dissolved in 870 g of ethyl acetate, thereafter once subjected to neutralizing separation washing by a mixed liquid of 250 g of water and 98 g of acetic acid, and further subjected to separation washing once by 225 g of water and 75 g of pyridine, and four times by 225 g of water. Thereafter, the ethyl acetate solution of the upper layer was concentrated, dissolved in 250 g of acetone, precipitated in 15 L of water, and filtered, followed by vacuum drying at 50° C. for 40 hours, to obtain 265 g of a white polymer.

The obtained polymer was subjected to $^{13}$C, $^{1}$H-NMR, and GPC measurements, thereby obtaining the following analysis results:

Copolymerization composition ratio (molar ratio):
hydroxystyrene: (Z-1)=77.0:23.0
Weight-average molecular weight (Mw)=4,800
Molecular weight distribution (Mw/Mn)=1.68
This polymer was regarded as (Polymer-5).

Synthesis Example 6

Poured into a flask of 3 L were 388.9 g of 4-hydroquinone monomethacrylate, and 139.8 g of (Z-1) monomer, as well as 675 g of methyl ethyl ketone as a solvent. This reaction vessel was cooled down to −70° C. under nitrogen atmosphere, and repetitively subjected to degasification under reduced pressure and to a nitrogen flow, three times. After temperature elevation up to a room temperature, 40.1 g of 2.2'-azobis(2,4-dimethylvaleronitrile): V-65 (produced by Wako Pure Chemical Industries, Ltd.) as a polymerization initiator was added into the mixture; after further temperature elevation up to 45° C., reaction was conducted for 20 hours; and after temperature elevation thereafter up to 55° C., reaction was further conducted for 20 hours. This reaction solution was precipitated in 15.0 L of a hexane solution; and the obtained white solid was filtered, followed by drying at 40° C. under reduced pressure, to obtain 315 g of a white polymer.

The obtained polymer was subjected to $^{13}C$, $^1H$-NMR, and GPC measurements, thereby obtaining the following analysis results:
Copolymerization composition ratio (molar ratio):
4-hydroquinone monomethacrylate: (Z-1)=76.6:23.4
Weight-average molecular weight (Mw)=5,200
Molecular weight distribution (Mw/Mn)=1.62
This polymer was regarded as (Polymer-6).

Comparative Synthesis Example 1

Poured into a flask of 3 L were 238.0 g of acetoxystyrene, 22.6 g of 4-chlorostyrene, and 189.4 g of indene, as well as 675 g of toluene as a solvent. This reaction vessel was cooled down to −70° C. under nitrogen atmosphere, and repetitively subjected to degasification under reduced pressure and to a nitrogen flow, three times. After temperature elevation up to a room temperature, 40.5 g of 2.2'-azobis(2,4-dimethylvaleronitrile): V-65 (produced by Wako Pure Chemical Industries, Ltd.) as a polymerization initiator was added into the mixture; after further temperature elevation up to 45° C., reaction was conducted for 20 hours; and after temperature elevation thereafter up to 55° C., reaction was further conducted for 20 hours. This reaction solution was then concentrated to ½, and precipitated in 15.0 L of a methanol solution; and the obtained white solid was filtered, followed by drying at 40° C. under reduced pressure, to obtain 311 g of a white polymer.

This polymer was again dissolved in a mixture of 488 g of methanol and 540 g of tetrahydrofuran, followed by addition of 162 g of triethylamine and 32 g of water thereinto, thereby conducting a deprotection reaction at 60° C. for 40 hours. As a fractionation step, after the reaction solution was concentrated, it was dissolved in a mixed solvent of 548 g of methanol and 112 g of acetone, and then 990 g of hexane was dropped into the solution for 10 minutes. This mixed white turbid solution was settled and separated into the layers, and the lower layer (polymer layer) was taken out, and concentrated. Further, the condensed polymer was dissolved again in a mixed solvent of 548 g of methanol and 112 g of acetone, a dispersion and separation operation to the solution was done by using 990 g of hexane, and the obtained lower layer (polymer layer) was concentrated. This condensed solution was dissolved in 870 g of ethyl acetate, thereafter once subjected to neutralizing separation washing by a mixed liquid of 250 g of water and 98 g of acetic acid, and further subjected to separation washing once by 225 g of water and 75 g of pyridine, and four times by 225 g of water. Thereafter, the ethyl acetate solution of the upper layer was concentrated, dissolved in 250 g of acetone, precipitated in 15 L of water, and filtered, followed by vacuum drying at 50° C. for 40 hours, to obtain 187 g of a white polymer.

The obtained polymer was subjected to $^{13}C$, $^1H$-NMR, and GPC measurements, thereby obtaining the following analysis results:
Copolymerization composition ratio (molar ratio):
hydroxystyrene: 4-chlorostyrene: indene=76.0:6.5:17.5
Weight-average molecular weight (Mw)=4,200
Molecular weight distribution (Mw/Mn)=1.59
This polymer was regarded as (Polymer-7).

Examples 1 to 6 and Comparative Example 1

As shown below, a base polymer, an acid generator, a basic component, a crosslinker, a surfactant and a solvent were blended in the ratio shown in Table 1 to prepare each negative resist composition of Examples and Comparative Examples.

Base polymers in the resist composition used in Examples of the present invention are Polymer-1 to Polymer-6 obtained in Synthesis Examples 1 to 6, respectively. Base polymer used in Comparative Examples is Polymer-7 obtained in Comparative Synthesis Examples 1.

The acid generators used in following Examples and Comparative Examples are triphenylsulfonium-nonafluoro-1-butanesulfonate as PAG-1, triphenylsulfonium-2,4,6-triisopropylbenzenesulfonate as PAG-2.

The crosslinker used for Polymer 7 is tetramethoxymethylglycoluril.

The resist compositions and solvents used in the present invention are enumerated below: propylene glycol monomethyl ether acetate (PGMEA) as solvent A, ethyl lactate (EL) as solvent B.

Further, the following compounds are amine compounds having a carboxyl group and not having a hydrogen atom covalently bonded to a base-center nitrogen atom and basic compounds having no carboxyl groups, used in following Examples and Comparative Examples, respectively (Quenchers).
Quencher-1: p-diethylaminobenzoic acid
Quencher-2: p-dibutylaminobenzoic acid
Quencher-3: oxide of p-dibutylaminobenzoic acid
Quencher-4: 1-piperidinepropionic acid
Quencher-5: tris(2-(methoxymethoxy)ethyl)amine
Quencher-6: oxide of tris(2-(methoxymethoxy)ethyl)amine
Quencher-7: N-2-(acetoxy)ethyl-imidazole
Surfactant A is PF-636 (produced by Omnova Solutions Inc.).

TABLE 1

| Composition (mass part) | Ex. 1 | Ex. 2 | Ex. 3 | Ex. 4 | Ex. 5 | Ex. 6 | Com. Ex. 1 |
|---|---|---|---|---|---|---|---|
| Polymer-1 | 80 | | | | | | |
| Polymer-2 | | 80 | | | | | |
| Polymer-3 | | | 80 | | | | |
| Polymer-4 | | | | 80 | | | |
| Polymer-5 | | | | | 80 | | |
| Polymer-6 | | | | | | 80 | |
| Polymer-7 | | | | | | | 80 |
| PAG-1 | 10 | 10 | 10 | 10 | 10 | 10 | 10 |

TABLE 1-continued

| Composition (mass part) | Ex. 1 | Ex. 2 | Ex. 3 | Ex. 4 | Ex. 5 | Ex. 6 | Com. Ex. 1 |
|---|---|---|---|---|---|---|---|
| Crosslinker | | | | | | | 8.2 |
| Quencher-1 | 0.1 | 0.1 | 0.1 | 0.1 | 0.1 | 0.1 | 0.1 |
| Quencher-4 | 0.1 | 0.1 | 0.1 | 0.1 | 0.1 | 0.1 | 0.1 |
| Surfactant A | 0.07 | 0.07 | 0.07 | 0.07 | 0.07 | 0.07 | 0.07 |
| Solvent A | 800 | 800 | 800 | 800 | 800 | 800 | 800 |
| Solvent B | 1800 | 1800 | 1800 | 1800 | 1800 | 1800 | 1800 |

The obtained negative resist compositions were each filtered by a filter of 0.04 μm size made of nylon resin, followed by spin coating of each resist solution at a revolution speed of 1,700 rpm onto a mask blank of 152 mm square having an outermost surface made of a chromium oxynitride film, into a coated thickness of 90 nm.

Next, each mask blank was baked for 10 minutes on a hot plate at 110° C. Measurement of a thickness of each obtained resist film was conducted by an optical measurement device NanoSpec (manufactured by Nanometrics Inc.). The measurement was conducted at 81 in-plane points of an applicable blank substrate except for an outer peripheral region within 10 mm from an outer edge to an inner extent, so as to calculate an averaged film thickness and a film thickness range.

Further, exposure was conducted by an electron beam exposure apparatus (EBM5000 Acceleration Voltage 50 keV manufactured by NuFLARE Technology, Inc.), followed by conduction of baking (PEB: post-exposure baking) at 120° C. for 10 minutes and subsequent spray development by aqueous solution of 2.38% tetramethylammonium hydroxide, thereby allowing for obtainment of negative patterns (Examples 1 to 6, and Comparative Example 1).

The obtained resist patterns were evaluated as follows.

Assuming that an exposure dose for resolving top and bottom of a 200 nm line-and-space pattern at a resolution of 1:1 was an optimum exposure dose (sensitivity: Eop), the minimum line width of the line-and-space pattern found to be separated at this exposure dose was defined to be a resolution of the applicable evaluated resist. Further, the profile of each resolved resist pattern was observed at a cross-section of the resist by a scanning electron microscope, particularly in terms of presence or absence of undercuts at a substrate's interface of the resist. Shown in following Table 2 are evaluation results.

In Comparative Example 1, a base polymer having 4-hydroxystyrene units, 4-chlorostyrene units and indene units was used, and it was possible to form a pattern of 60 nm but impossible to develop a pattern of 50 nm or less because of a bridge. In addition, the chlorostyrene units have low crosslinking efficiency, thereby resulting in a low sensitivity of 21 μC.

Contrary, each base polymer used in Examples 1 to 6, having units having an oxirane ring has high crosslinking efficiency, thereby resulting in the sensitivity of about 10 μC. In addition, in all Examples, each pattern of 50 nm or less could be developed without an undercut or a bridge.

Further, each pattern obtained in Examples 1 to 4, in which an acenaphthylene or indene unit-introduced base polymer was used, had a higher resolution than that in Examples 5 and 6, in which such units were not introduced into a base polymer, and a pattern of 40 nm could be developed without an undercut or a bridge.

The acenaphthylene or indene unit-introduced polymer is considered to inhibit a pattern deformation in developing due to its rigidity.

TABLE 2

| | Resolution (nm) | Cross-sectional profile | Electron beam sensitivity (μC) |
|---|---|---|---|
| Ex. 1 | 40 | Good | 10 |
| Ex. 2 | 40 | Good | 10 |
| Ex. 3 | 40 | Good | 10 |
| Ex. 4 | 40 | Good | 10 |
| Ex. 5 | 45 | Good | 11 |
| Ex. 6 | 45 | Good | 11 |
| Com. Ex. 1 | 60 | Good | 21 |

Examples 7 to 13

As negative resist compositions of the present invention, the negative resist compositions were each prepared by blending an amine compound having a carboxyl group and not having a hydrogen atom covalently bonded to a base-center nitrogen atom, with an amine compound not having a carboxyl group in the ratio listed in following Table 3 as the component (C), and negative patterns were formed in the same manner as Examples 1 to 6. The resolutions and pattern profiles thereof were evaluated.

TABLE 3

| Composition (mass part) | Ex. 7 | Ex. 8 | Ex. 9 | Ex. 10 | Ex. 11 | Ex. 12 | Ex. 13 |
|---|---|---|---|---|---|---|---|
| Polymer-4 | 80 | 80 | 80 | 80 | 80 | 80 | 80 |
| PAG-1 | 10 | 10 | 10 | 10 | 10 | 10 | 10 |
| Quencher-1 | | | | 0.1 | | | |
| Quencher-2 | | | | | 0.1 | | |
| Quencher-3 | | | | | | 0.1 | |
| Quencher-4 | 0.1 | 0.1 | 0.1 | | | | |
| Quencher-5 | 0.1 | | | 0.1 | 0.1 | 0.1 | 0.2 |
| Quencher-6 | | 0.1 | | | | | |
| Quencher-7 | | | 0.1 | | | | |
| Surfactant A | 0.07 | 0.07 | 0.07 | 0.07 | 0.07 | 0.07 | 0.07 |

TABLE 3-continued

| Composition (mass part) | Ex. 7 | Ex. 8 | Ex. 9 | Ex. 10 | Ex. 11 | Ex. 12 | Ex. 13 |
|---|---|---|---|---|---|---|---|
| Solvent A | 800 | 800 | 800 | 800 | 800 | 800 | 800 |
| Solvent B | 1800 | 1800 | 1800 | 1800 | 1800 | 1800 | 1800 |

It was possible to form patterns of 40 nm without an undercut in all Examples each using a combination of any one of Quencher-1 to Quencher-4 as the amine compound having a carboxyl group and not having a hydrogen atom covalently bonded to a base-center nitrogen atom, with any one of Quencher-5 to Quencher-7 as the amine compound not having a carboxyl group.

In the case of Example 13 using Quencher-5 solely, which is an amine compound not having a carboxyl group, a pattern of 40 nm collapsed because of an undercut but a pattern of 50 nm could be formed. It is assumed that an undercut occurred in the pattern of 50 nm but the pattern was prevented from collapsing due to the oxirane ring effect.

Examples 14 to 19

As negative resist compositions of the present invention, the negative resist compositions were each prepared by blending an amine compound having a carboxyl group and not having a hydrogen atom covalently bonded to a base-center nitrogen atom, with an amine compound not having a carboxyl group in the ratio listed in following Table 4 as a basic component, and negative patterns were formed in the same manner as Examples 1 to 6. The resolutions and pattern profiles thereof were evaluated.

TABLE 4

| Composition (mass part) | Ex. 14 | Ex. 15 | Ex. 16 | Ex. 17 | Ex. 18 | Ex. 19 |
|---|---|---|---|---|---|---|
| Polymer-4 | 80 | 80 | 80 | 80 | 80 | 80 |
| PAG-1 | 10 | 10 | 10 | 10 | 10 | 10 |
| Quencher-1 | 0.1 | 0.1 | 0.1 | | | |
| Quencher-4 | | | | 0.1 | 0.2 | 0.3 |
| Quencher-5 | 0.2 | | | | | |
| Quencher-6 | | 0.2 | | | | |
| Quencher-7 | | | 0.2 | | | |
| Surfactant A | 0.07 | 0.07 | 0.07 | 0.07 | 0.07 | 0.07 |
| Solvent A | 800 | 800 | 800 | 800 | 800 | 800 |
| Solvent B | 1800 | 1800 | 1800 | 1800 | 1800 | 1800 |
| Electron beam sensitivity ($\mu C/cm^2$) | 13 | 14 | 14 | 5 | 11 | 15 |

Increased amounts of amine compounds (Quenchers) resulted in deteriorated sensitivities but resolutions were never deteriorated. In all Examples, patterns of 40 nm could be formed without an undercut. Electron beam sensitivity is listed at the lowermost row of Table 4. Therefore, a sensitivity required in a process can be adjusted by an amount of an amine compound.

Examples 20 to 25 and Comparative Example 2

As negative resist compositions of the present invention, the resist compositions were each prepared, as listed in following Table 5, by adopting PAG-2 instead of PAG-1 as an acid generator and negative patterns were formed in the same manner as Examples 1 to 6. The results of evaluation conducted for the resolutions and pattern profiles thereof are listed in following Table 6.

PAG-2 generates an acid with a smaller diffusion than PAG-1, so that crosslinking efficiency is low and a sensitivity is lower by about 10 μC compared with Examples 1 to 6 in which PAG-1 was used. However, in all Examples, patterns of 45 nm or less could be formed without an undercut or a bridge. In Comparative Example 2, it was impossible to obtain a resolution of 50 nm or less because of a bridge.

TABLE 5

| Composition (mass part) | Ex. 20 | Ex. 21 | Ex. 22 | Ex. 23 | Ex. 24 | Ex. 25 | Com. Ex. 2 |
|---|---|---|---|---|---|---|---|
| Polymer-1 | 80 | | | | | | |
| Polymer-2 | | 80 | | | | | |
| Polymer-3 | | | 80 | | | | |
| Polymer-4 | | | | 80 | | | |
| Polymer-5 | | | | | 80 | | |
| Polymer-6 | | | | | | 80 | |
| Polymer-7 | | | | | | | 80 |
| PAG-2 | 10 | 10 | 10 | 10 | 10 | 10 | 10 |
| Crosslinker | | | | | | | 8.2 |
| Quencher-1 | 0.1 | 0.1 | 0.1 | 0.1 | 0.1 | 0.1 | 0.1 |
| Quencher-4 | 0.1 | 0.1 | 0.1 | 0.1 | 0.1 | 0.1 | 0.1 |
| Surfactant A | 0.07 | 0.07 | 0.07 | 0.07 | 0.07 | 0.07 | 0.07 |
| Solvent A | 800 | 800 | 800 | 800 | 800 | 800 | 800 |
| Solvent B | 1800 | 1800 | 1800 | 1800 | 1800 | 1800 | 1800 |

TABLE 6

|  | Resolution (nm) | Cross-sectional profile | Electron beam sensitivity (μC) |
|---|---|---|---|
| Ex. 20 | 40 | Good | 20 |
| Ex. 21 | 40 | Good | 20 |
| Ex. 22 | 40 | Good | 20 |
| Ex. 23 | 40 | Good | 20 |
| Ex. 24 | 45 | Good | 21 |
| Ex. 25 | 45 | Good | 21 |
| Com. Ex. 2 | 60 | Good | 34 |

Examples 26 to 31 and Comparative Example 3

As the negative resist composition of the present invention, the negative resist compositions were each prepared, as listed in following Table 7, by increasing the solvent amount of Examples 1 to 6 and negative patterns were formed in the same manner as Examples 1 to 6. Each film thickness was 60 nm under the same coating condition due to the increase of the solvents.

The results of evaluation conducted for the resolutions and pattern profiles thereof are listed in following Table 8.

Each sensitivity result was lowered by 1 μC because of thinner film thickness, but each resolution was improved. In all Examples, patterns of 40 nm or less could be formed without an undercut or a bridge. In Comparative Example 3, it was impossible to obtain a resolution of 50 nm or less because of a bridge.

TABLE 7

| Composition (mass part) | Ex. 26 | Ex. 27 | Ex. 28 | Ex. 29 | Ex. 30 | Ex. 31 | Com. Ex. 3 |
|---|---|---|---|---|---|---|---|
| Polymer-1 | 80 | | | | | | |
| Polymer-2 | | 80 | | | | | |
| Polymer-3 | | | 80 | | | | |
| Polymer-4 | | | | 80 | | | |
| Polymer-5 | | | | | 80 | | |
| Polymer-6 | | | | | | 80 | |
| Polymer-7 | | | | | | | 80 |
| PAG-1 | 10 | 10 | 10 | 10 | 10 | 10 | 10 |
| Crosslinker | | | | | | | 8.2 |
| Quencher-1 | 0.1 | 0.1 | 0.1 | 0.1 | 0.1 | 0.1 | 0.1 |
| Quencher-4 | 0.1 | 0.1 | 0.1 | 0.1 | 0.1 | 0.1 | 0.1 |
| Surfactant A | 0.07 | 0.07 | 0.07 | 0.07 | 0.07 | 0.07 | 0.07 |
| Solvent A | 1100 | 1100 | 1100 | 1100 | 1100 | 1100 | 1100 |
| Solvent B | 2600 | 2600 | 2600 | 2600 | 2600 | 2600 | 2600 |

TABLE 8

|  | Resolution (nm) | Cross-sectional profile | Electron beam sensitivity (μC) |
|---|---|---|---|
| Ex. 26 | 35 | Good | 11 |
| Ex. 27 | 35 | Good | 11 |
| Ex. 28 | 35 | Good | 11 |
| Ex. 29 | 35 | Good | 11 |
| Ex. 30 | 40 | Good | 12 |
| Ex. 31 | 40 | Good | 12 |
| Com. Ex. 3 | 55 | Good | 23 |

The present invention is not limited to the above embodiments. The above embodiments are merely illustrative, and whatever having the substantially same configurations as the technical concept recited in the claims of the present application and exhibiting the same functions and effects are embraced within the technical scope of the present invention.

What is claimed is:

1. A negative resist composition comprising at least:
(A) a base polymer that is alkaline-soluble and is made alkaline-insoluble by action of an acid;
(B) an acid generator; and
(C) a basic component,
   wherein the base polymer at least contains a polymer including repeating units represented by the following: general formula (1), general formula (2), and general formula (3), and having a weight average molecular weight of 1,000 to 10,000,

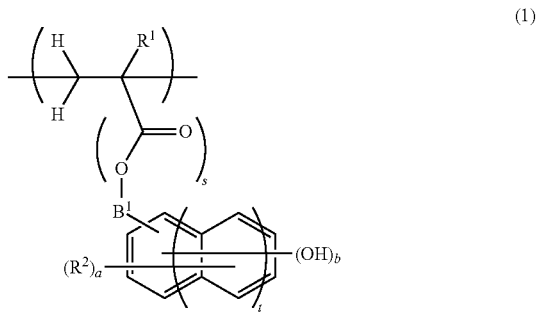

(1)

-continued

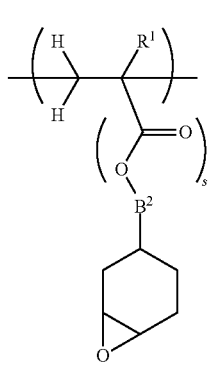

(2)

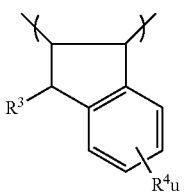
(3)

wherein $R^1$ independently represents a hydrogen atom or a methyl group; s represents 0 or 1; t represents an integer of 0 to 2; $R^2$ represents a hydrogen atom or an alkyl group having 1 to 6 carbon atoms; each $B^1$ and $B^2$ independently represents a single bond or an alkylene group having 1 to 10 carbon atoms which may contain one or a plurality of an ether bond in the chain of the alkylene group; and a represents an integer of 0 to 3 and b represents an integer of 1 to 3; and each of $R^3$ and $R^4$ independently represents a hydrogen atom, a halogen atom, an optionally substituted hydroxyl group, an alkoxy group or an alkyl group, and u represents an integer of 0 to 5, and wherein, the basic component (C) contains at least one or more kinds of amine compounds having a carboxyl group and not having a hydrogen atom covalently bonded to a base-center nitrogen atom, and the amine compound being represented by the following general formula (5), general formula (6), or the general formula (7),

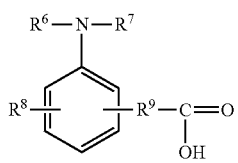
(5)

wherein each $R^6$ and $R^7$ independently represents a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, or an alkyl thioalkyl group having 1 to 10 carbon atoms; $R^6$ and $R^7$ may be bonded to form a cyclic structure; $R^8$ represents a hydrogen atom, a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, an alkyl thioalkyl group having 1 to 10 carbon atoms, or a halogen group; $R^9$ represents a single bond, a linear, a branched or a cyclic alkylene group having 1 to 20 carbon atoms, or an arylene group having 6 to 20 carbon atoms;

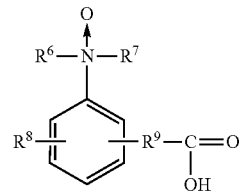
(6)

wherein $R^6$, $R^7$, $R^8$, and $R^9$ represent the same meaning as before;

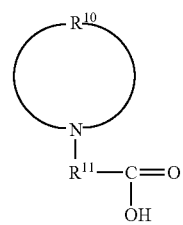
(7)

wherein $R^{10}$ represents a linear or a branched optionally substituted alkylene group having 2 to 20 carbon atoms which may contain one or a plurality of a carbonyl group, an ether group, an ester group, and a sulfide between the carbon-carbon bond of the alkylene group; and $R^{11}$ represents a linear, a branched or a cyclic alkylene group having 1 to 20 carbon atoms, or an arylene group having 6 to 20 carbon atoms.

2. The negative resist composition according to claim 1, wherein the basic component (C) further contains, in addition to the amine compound having a carboxyl group and not having a hydrogen atom covalently bonded to a base-center nitrogen atom, at least one or more kinds of the amine compounds represented by the following general formula (8) and general formula (9),

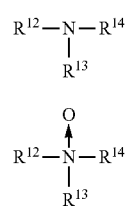

wherein each $R^{12}$, $R^{13}$, and $R^{14}$ independently represents a hydrogen atom, a linear, a branched, or a cyclic alkyl group having 1 to 20 carbon atoms, an aryl group having 6 to 20 carbon atoms, an aralkyl group having 7 to 20 carbon atoms, a hydroxy alkyl group having 2 to 10 carbon atoms, an alkoxy alkyl group having 2 to 10 carbon atoms, an acyloxy alkyl group having 3 to 10 carbon atoms, or an alkyl thioalkyl group having 1 to 10 carbon atoms; and two of $R^{12}$, $R^{13}$ and $R^{14}$ may be bonded to form a cyclic structure or an aromatic ring.

3. A resist patterning process by a lithography, wherein, at least, a resist film is formed over a substrate to be processed by using the negative resist composition according to claim 1, and the resist film is exposed to a high energy beam and then developed by an aqueous alkaline developer to obtain a resist pattern.

4. A resist patterning process by a lithography, wherein, at least, a resist film is formed over a substrate to be processed by using the negative resist composition according to claim 2, and the resist film is exposed to a high energy beam and then developed by an aqueous alkaline developer to obtain a resist pattern.

5. The resist patterning process according to claim 3, wherein a film thickness of the resist film is 10 nm or more and less than 100 nm.

6. The resist patterning process according to claim 4, wherein a film thickness of the resist film is 10 nm or more and less than 100 nm.

7. The resist patterning process according to claim 3, wherein a photomask blank is used as the substrate to be processed.

8. The resist patterning process according to claim 4, wherein a photomask blank is used as the substrate to be processed.

9. The resist patterning process according to claim 5, wherein a photomask blank is used as the substrate to be processed.

10. The resist patterning process according to claim 6, wherein a photomask blank is used as the substrate to be processed.

11. The resist patterning process according to claim 7, wherein a photomask blank having an outermost surface made of a chromium compound film is used as the photomask blank.

12. The resist patterning process according to claim 8, wherein a photomask blank having an outermost surface made of a chromium compound film is used as the photomask blank.

13. The resist patterning process according to claim 9, wherein a photomask blank having an outermost surface made of a chromium compound film is used as the photomask blank.

14. The resist patterning process according to claim 10, wherein a photomask blank having an outermost surface made of a chromium compound film is used as the photomask blank.

* * * * *